United States Patent [19]

Gargini et al.

[11] 4,441,247

[45] Apr. 10, 1984

[54] METHOD OF MAKING MOS DEVICE BY FORMING SELF-ALIGNED POLYSILICON AND TUNGSTEN COMPOSITE GATE

[75] Inventors: Paolo Gargini, Palo Alto; Israel Beinglass, Santa Clara; Norman Ahlquist, Menlo Park, all of Calif.

[73] Assignee: Intel Corporation, Santa Clara, Calif.

[21] Appl. No.: 278,656

[22] Filed: Jun. 29, 1981

[51] Int. Cl.³ .................. H01L 29/72; H01L 21/26
[52] U.S. Cl. .................. 29/571; 29/576 B; 148/1.5; 148/187; 357/59; 357/91; 427/88; 427/89
[58] Field of Search .......... 148/1.5, 187; 29/571, 29/576 B; 357/59, 91; 427/88, 89

[56] References Cited

U.S. PATENT DOCUMENTS

| | | | |
|---|---|---|---|
| 4,074,301 | 2/1978 | Paivinen et al. | 357/23 |
| 4,085,498 | 4/1978 | Rideout | 29/571 |
| 4,128,670 | 12/1978 | Gaensslen | 427/86 |
| 4,141,022 | 2/1979 | Sigg et al. | 357/23 |
| 4,210,993 | 7/1980 | Sunami | 29/571 |
| 4,324,038 | 4/1982 | Chang et al. | 29/571 |
| 4,330,931 | 5/1982 | Liu | 29/571 |

FOREIGN PATENT DOCUMENTS 56-49542  5/1981  Japan.

OTHER PUBLICATIONS

Okada et al., IEEE-Solid St. Circuits, 13 (1978) 693.
Icecap Report, Issue 1-12, 1981, pp. 1-12.
Gargini et al., IEDM, Dec. 1981, pp. 54-57.

*Primary Examiner*—Upendra Roy
*Attorney, Agent, or Firm*—Blakely, Sokoloff, Taylor & Zafman

[57] ABSTRACT

A process is described for forming MOS circuits which include underlying polysilicon members such as gate members covered with metal. In one embodiment, a self-aligning tungsten process is used to cover the polysilicon members. Low temperature "rear end" steps are used to prevent deterioration of the underlying metal. For example, a plasma nitride protective layer is used to cover the metal. The polysilicon/metal members provide reduced resistance and increase the speed of the resultant MOS circuits.

21 Claims, 23 Drawing Figures

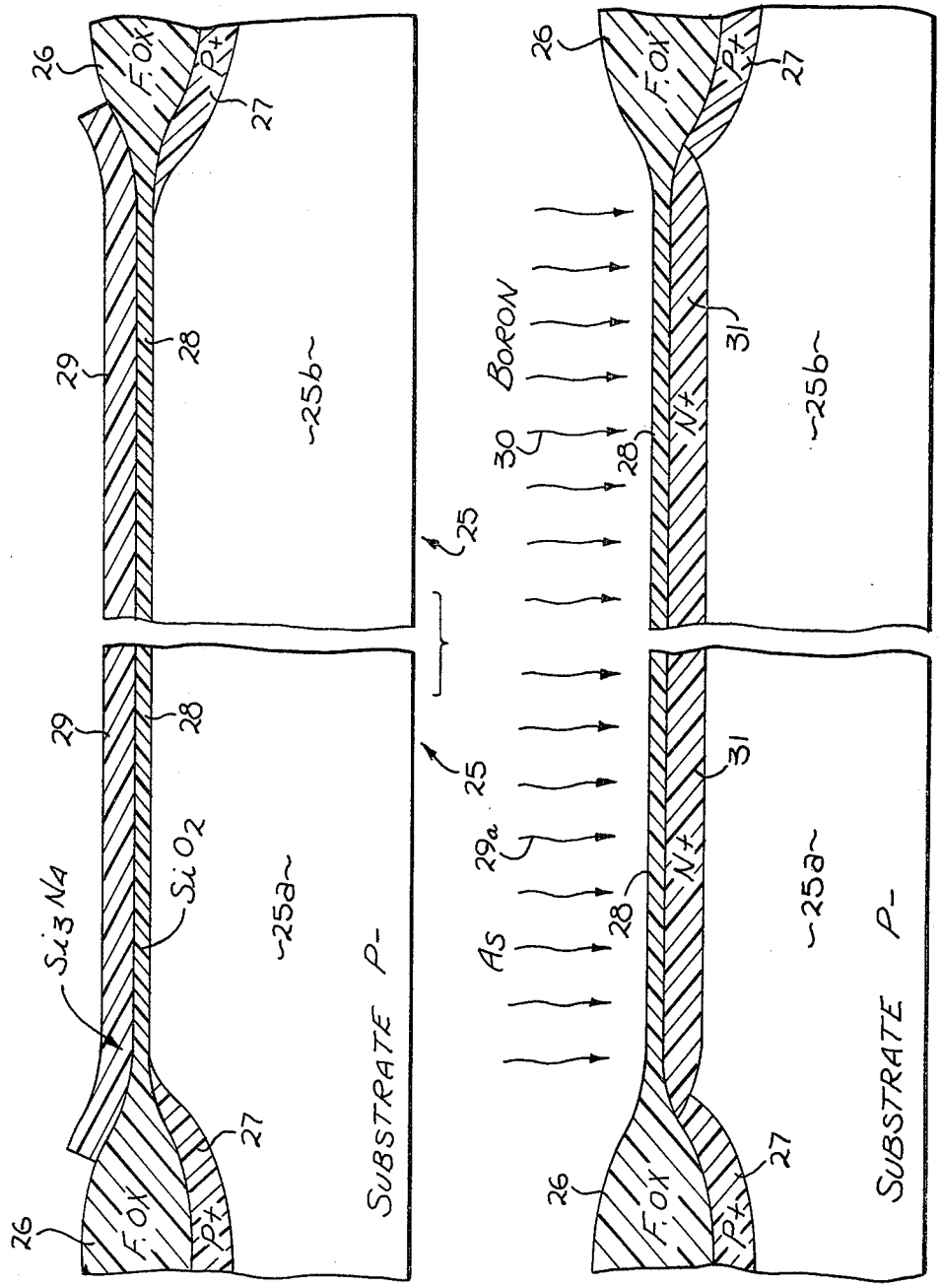

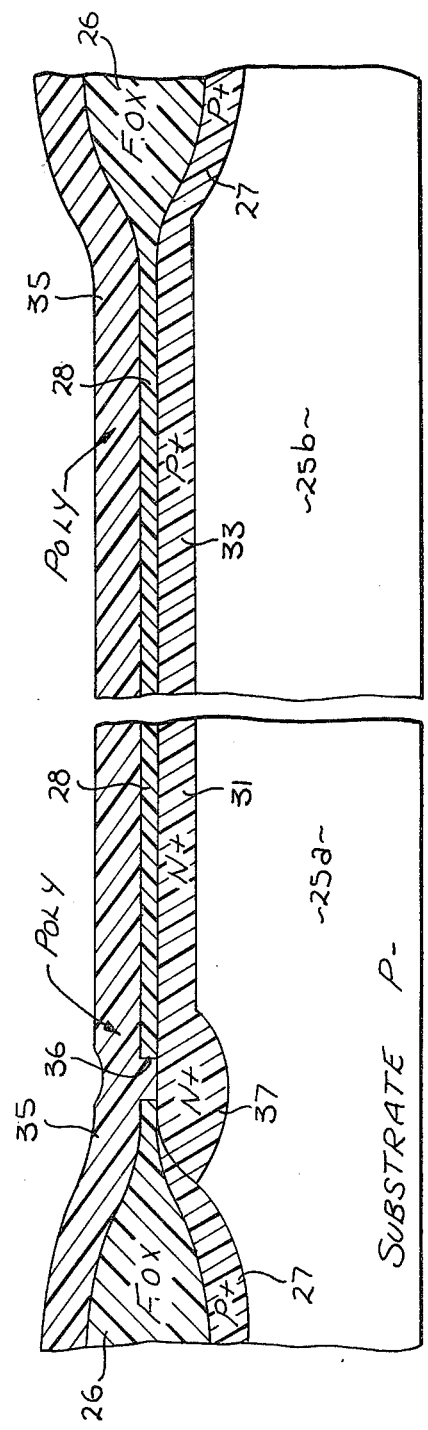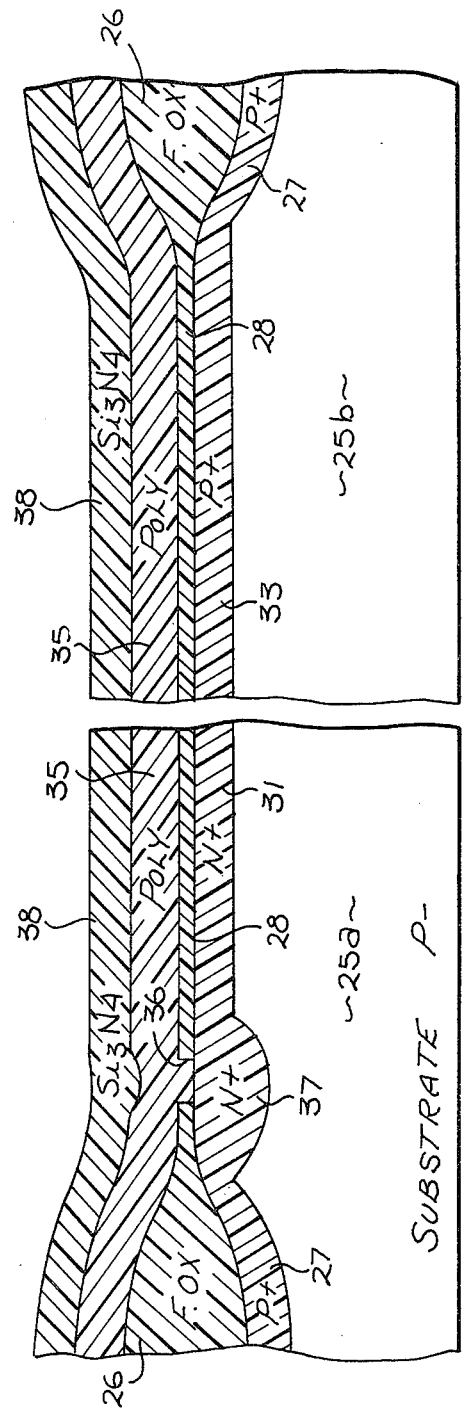

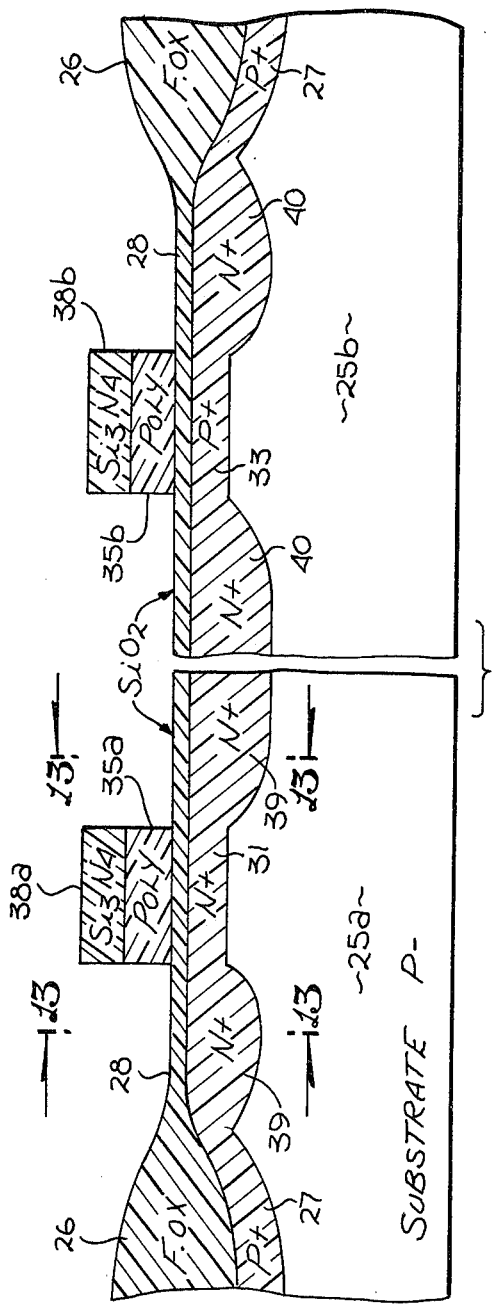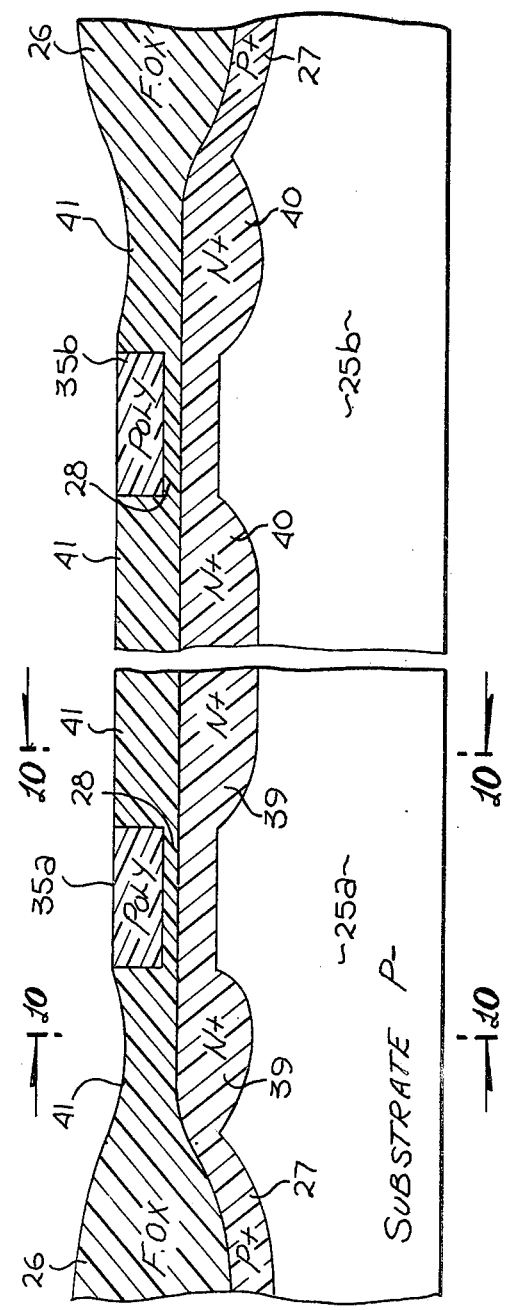
Fig. 5
Fig. 6

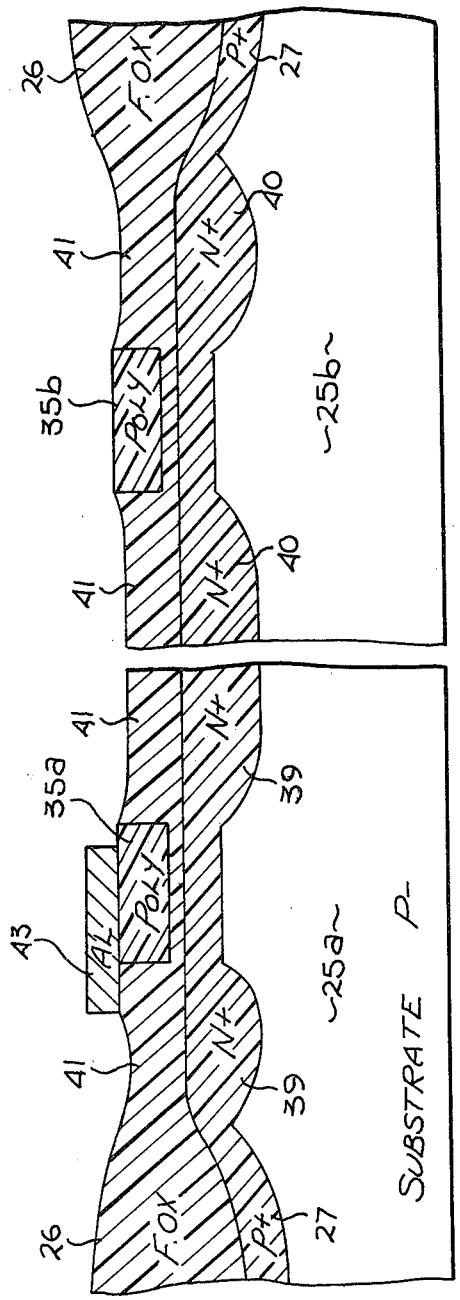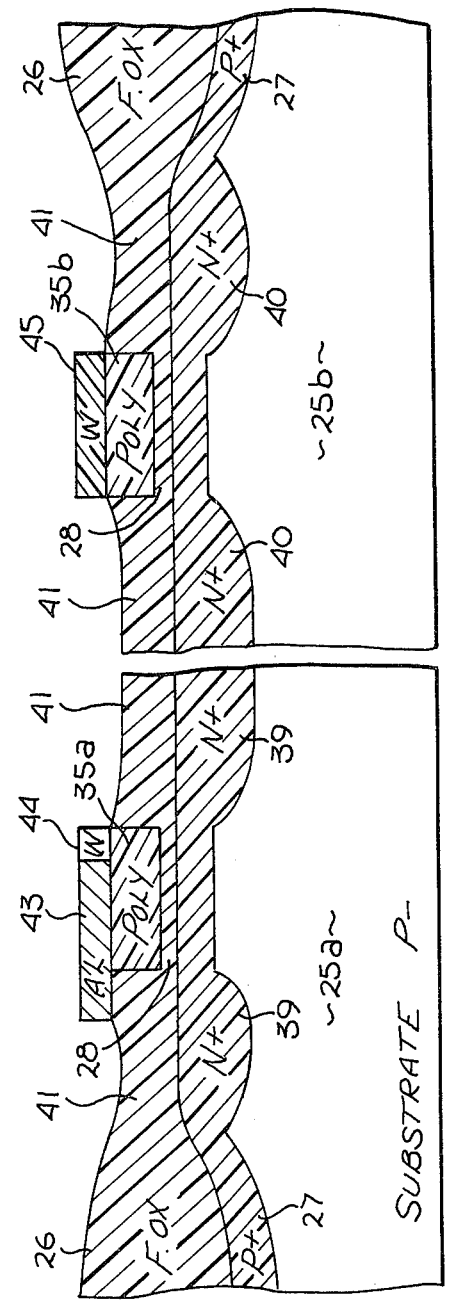

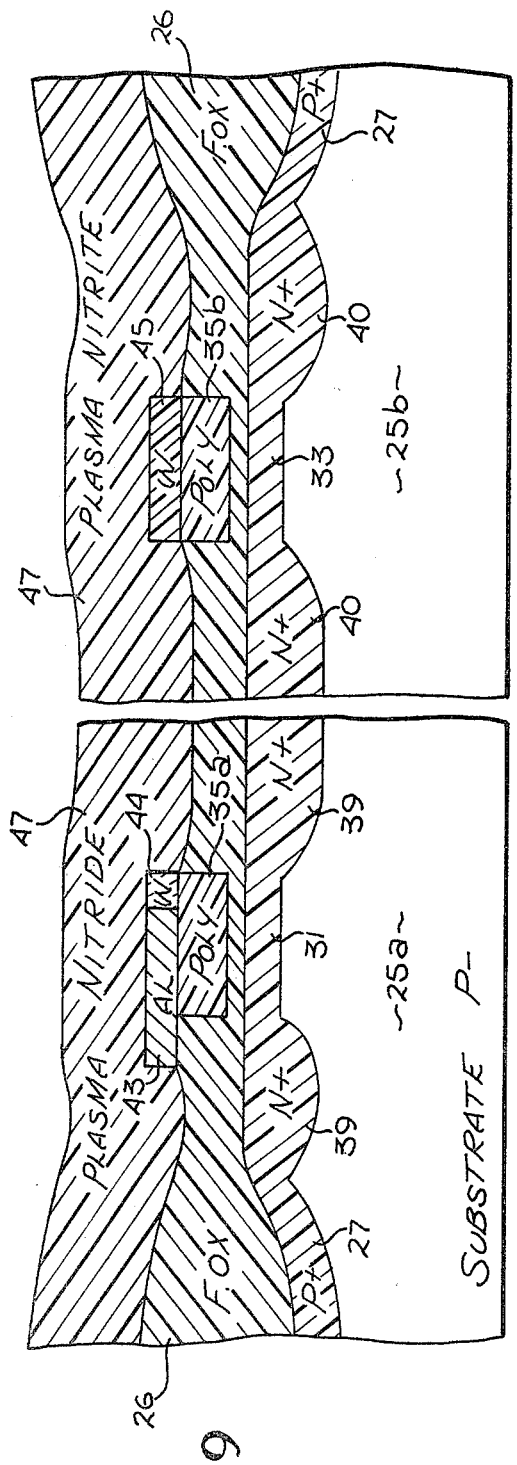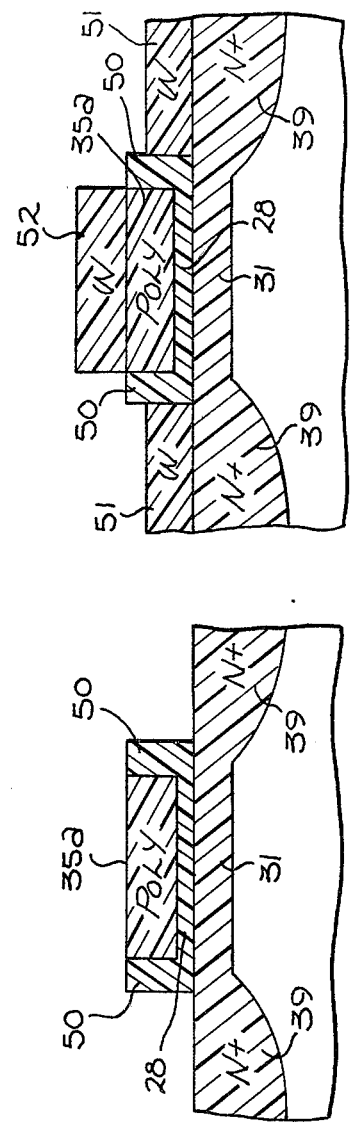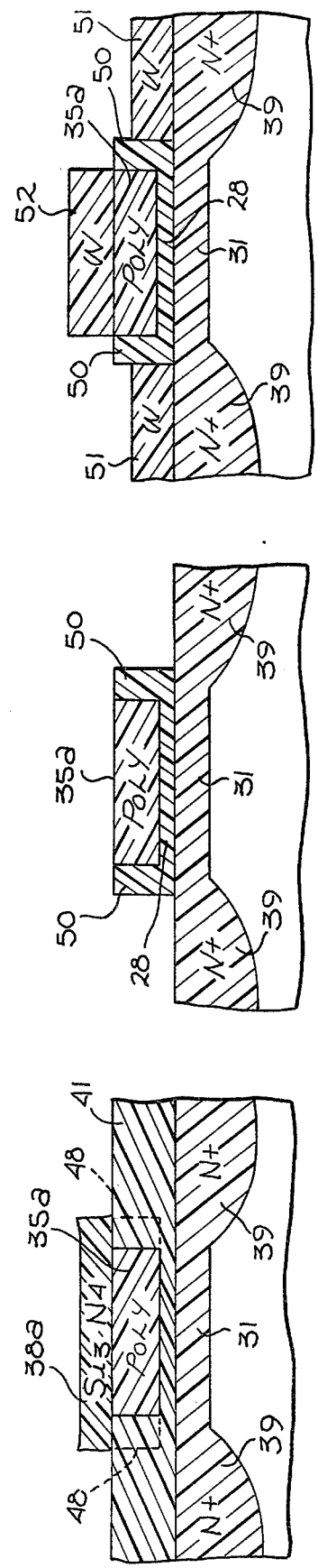

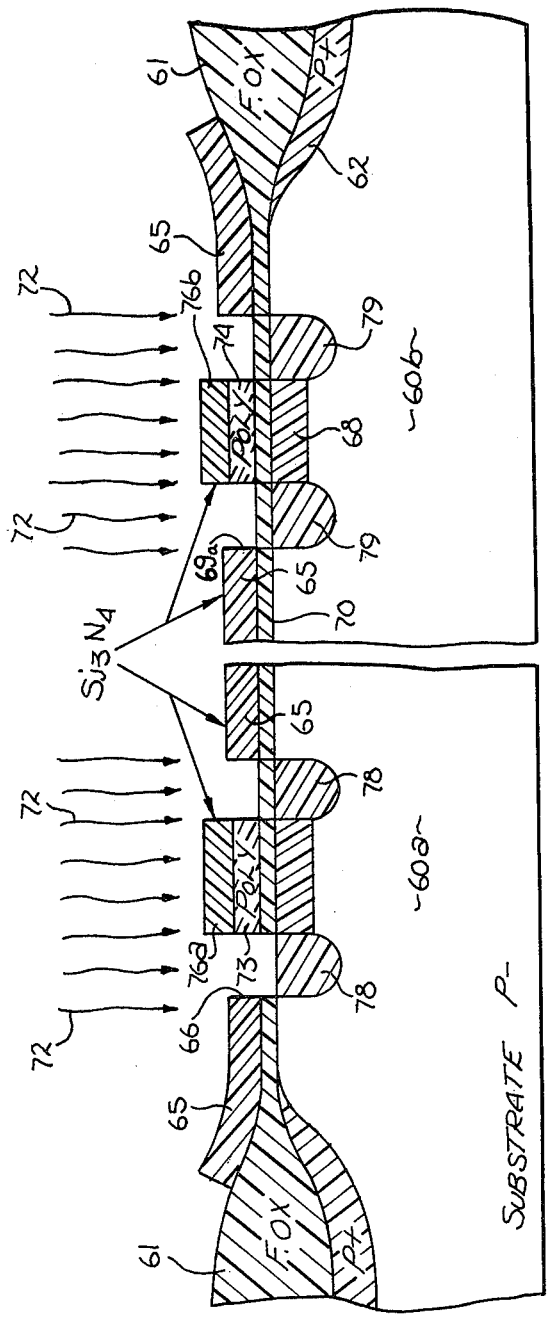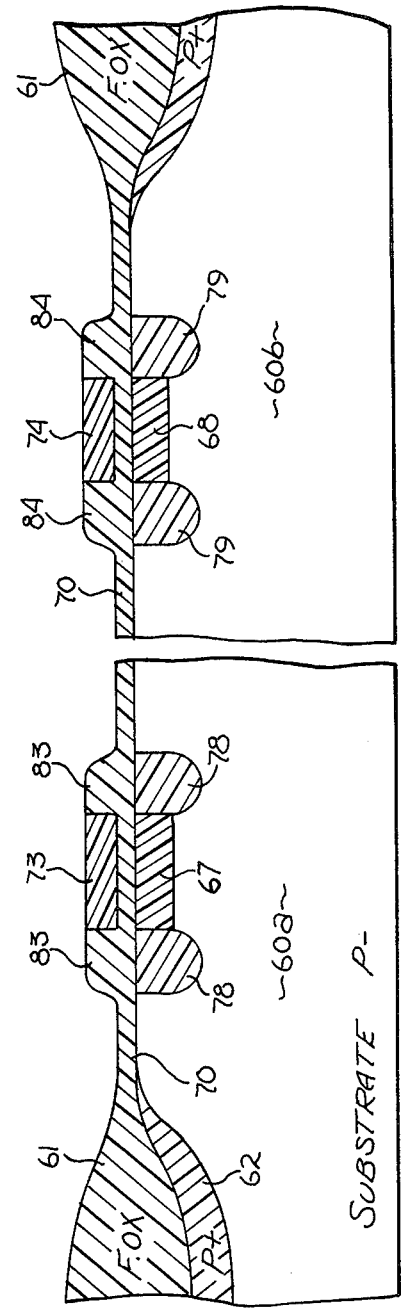
Fig. 19
Fig. 20

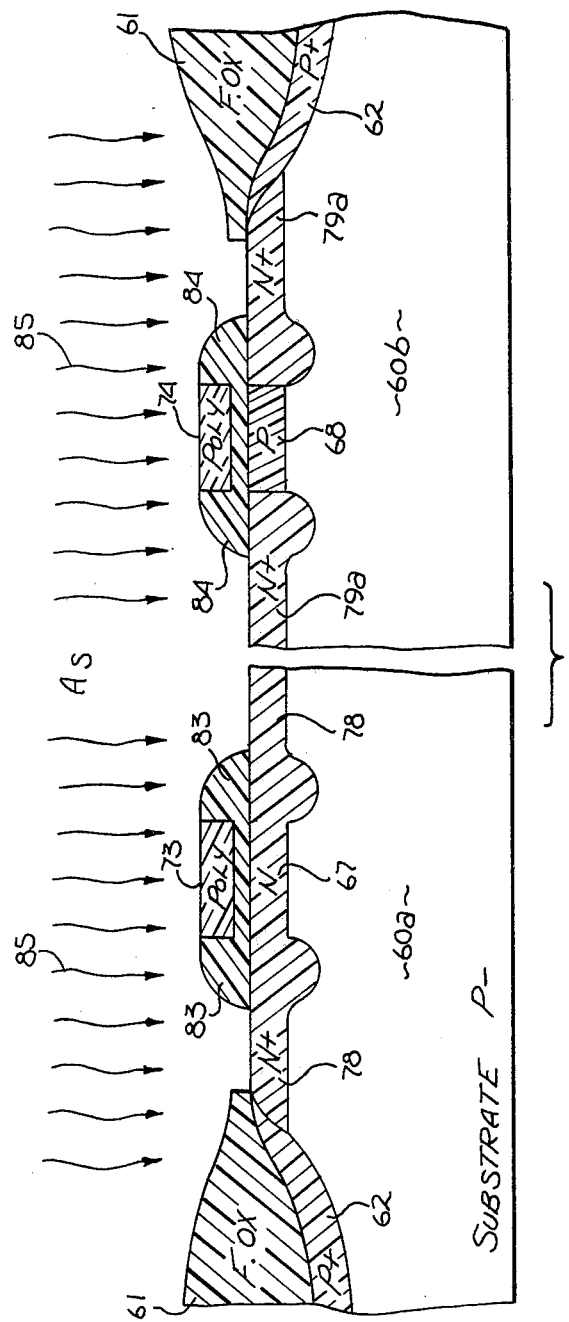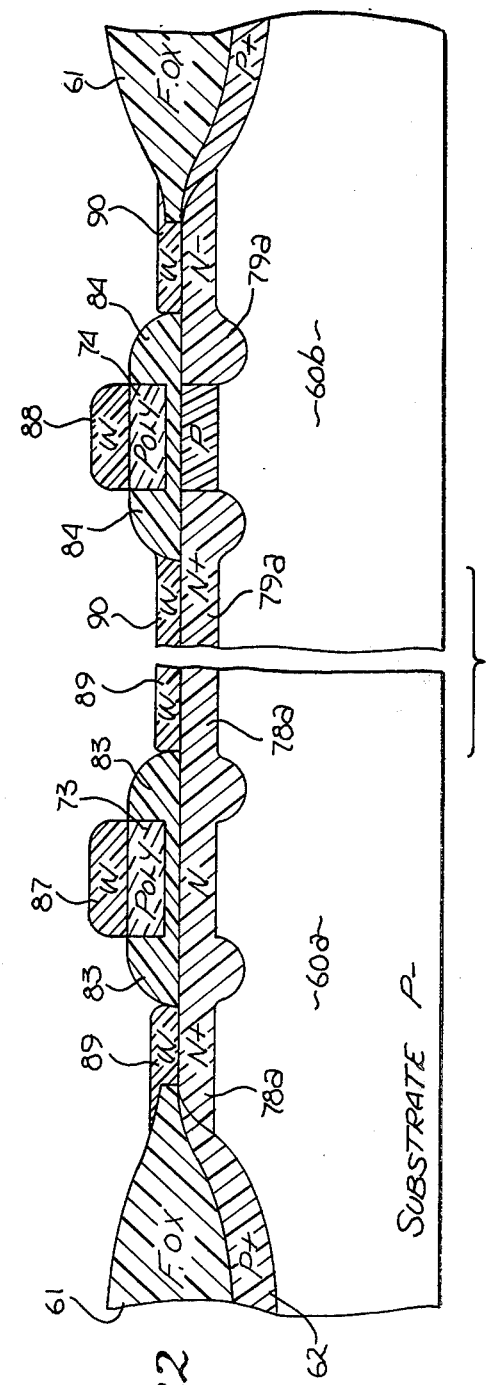

4,441,247

METHOD OF MAKING MOS DEVICE BY FORMING SELF-ALIGNED POLYSILICON AND TUNGSTEN COMPOSITE GATE

BACKGROUND OF THE INVENTION

1. Field of the Invention

The invention relates to the field of MOS processing.

2. Prior Art

In the fabrication of metal-oxide-semiconductor (MOS) integrated circuits, particularly in processes employing polysilicon, a glass layer is typically formed over the polysilicon members. This glass layer is generally a doped silicon dioxide used to protect the underlying circuit members. Openings are formed in this glass layer to permit overlying metal members to contact either substrate regions or polysilicon members. To provide good metal step coverage on the glass layer, the glass layer is generally subjected to a relatively high temperature causing the glass to reflow, thereby rounding sharp corners. This reflowing step is performed prior to any metallization, since the temperatures associated with the reflowing will cause problems such as oxidation or the formation of silicides (in the case of refractory metals) or melting (in the case of aluminum).

This high temperature glass reflowing step prevents the formation of metal members below the glass layer, and thus typically polysilicon, not metal members are formed below the glass layer. Polysilicon, even when highly doped, has a high resistance when compared to metal. This higher resistance reduces the speed of MOS circuits.

Typical MOS processes using glass layers are discussed in U.S. Pat. Nos. 4,033,026 and 4,052,229.

As will be seen, the present invention permits formation of metal members in contact with the polysilicon members thereby reducing the resistance of the polysilicon members. Low temperature "rear end" processing is used to prevent damage to the underlying metal. ("Rear end" processing refers to that part of the MOS processing after patterning of the gates and doping of the source and drain regions and other steps before the application of a low temperature protective layer).

SUMMARY OF THE INVENTION

A process for fabricating a metal-oxide-semiconductor (MOS) integrated circuit on a silicon substrate is described. A first oxide layer is formed on the substrate followed by a formation of a polysilicon layer over this oxide layer. Then a silicon nitride layer is formed over the polysilicon layer. Circuit members are formed from the polysilicon layers such as gate members and interconnect lines; these members are etched with masks formed from the silicon nitride layer. Source and drain regions are next formed in alignment with the gate members. Now a second oxide layer is grown on the substrate; the silicon nitride members prevent oxide growth on the polysilicon members. After removal of the remaining silicon nitride, metal members are formed on selected polysilicon members. Then a protective layer is formed above the circuit; the subsequent processing is at a sufficiently low temperature to prevent deterioration of the metal members. In this manner, low resistance, polysilicon/metal buried members are formed in an MOS circuit.

BRIEF DESCRIPTION OF THE DRAWINGS

FIG. 1 is a cross-sectional elevation view of a substrate which includes field oxide regions, a first silicon dioxide layer and a silicon nitride layer.

FIG. 2 illustrates the substrate of FIG. 1 during ion implantation steps.

FIG. 3 illustrates the substrate of FIG. 2 with a buried contact region and with a polysilicon layer.

FIG. 4 illustrates the substrate of FIG. 3 with a silicon nitride layer over the polysilicon layer.

FIG. 5 illustrates the substrate of FIG. 4 with gate members and after an additional doping step.

FIG. 6 illustrates the substrate of FIG. 5 with a second oxide layer.

FIG. 7 illustrates the substrate of FIG. 6 after a metallization step.

FIG. 8 illustrates the substrate of FIG. 7 after an additional metallization step.

FIG. 9 illustrates the substrate of FIG. 8 with a protective layer.

FIG. 10 generally shows a portion of the substrate of FIG. 6, taken through section lines 10—10 of FIG. 6.

FIG. 11 illustrates the substrate of FIG. 10 after the formation of the second oxide layer.

FIG. 12 illustrates the substrate of FIG. 11 after a metallization step.

FIG. 14 illustrates the substrate of FIG. 13 after the formation of the second oxide layer.

FIG. 15 illustrates the substrate of FIG. 14 after the formation of a photoresist layer.

FIG. 16 illustrates the substrate of FIG. 15 after an etching step and a metallization step.

FIGS. 17–23 illustrate alternate processing to the processing shown in FIG. 1–9.

FIG. 17 is a cross-sectional elevation view of a substrate which includes field oxide regions, an oxide layer, and an opening in the silicon nitride layer.

FIG. 18 illustrates the substrate of FIG. 17 after an additional masking step and during a second doping step.

FIG. 19 illustrates the substrate of FIG. 18 after the formation of gate members.

FIG. 20 illustrates the substrate of FIG. 19 after the growth of an additional oxide layer.

FIG. 21 illustrates the substrate of FIG. 20 after an etching step and during an ion implantation step.

FIG. 22 illustrates the substrate of FIG. 20 after a metallization step.

FIG. 23 illustrates the substrate of FIG. 22 after the formation of a protective layer and after an additional metallization step.

DETAILED DESCRIPTION OF THE INVENTION

Figure 13:
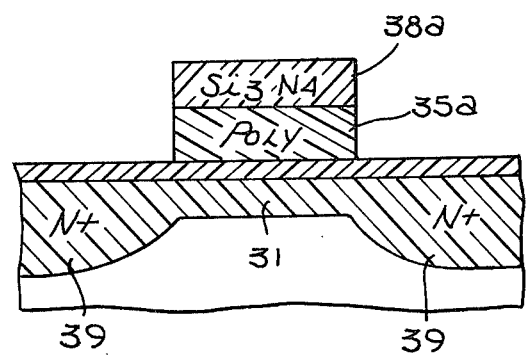
FIG. 13 illustrates a portion of the substrate of FIG. 5 generally taken through section lines 13—13 of FIG. 5. This figure
Figure 14:
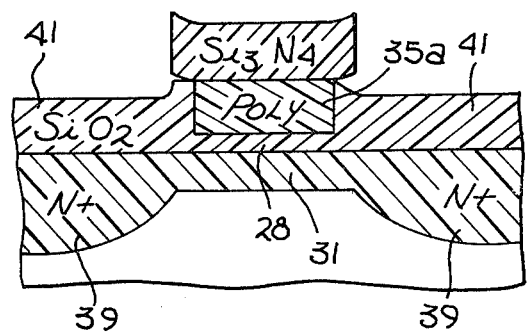
FIGS. 14–16 illustrate alternate processing for forming a buried contact region.

A metal-oxide-semiconductor (MOS) process is described which is particularly suitable for forming circuit members such as gate members of polysilicon covered with a metal. These circuit structures have lower resistance when compared to polysilicon circuit members without metal, and thus, the resultant integrated circuits operate at higher speeds. In the following description, numerous specific details are set forth such as specific layer thicknesses, etc., in order to provide a thorough understanding of the presently preferred process. However, it will be obvious to one skilled in the art that the invention may be practiced without these specific details. In other instances, well-known processing steps such as cleaning and masking steps have not been described in detail in order not to obscure the present invention in unnecessary detail.

Also in the following description, the formation of n-channel transistors is described, which transistors are fabricated on a p-type monocrystalline silicon substrate. It will be apparent to one skilled in the art that the process may be employed for the formation of p-channel transistors, CMOS integrated circuits, SOS circuits and with other technologies.

Referring now to FIG. 1, two sections of a substrate 25 are illustrated (sections 25a and 25b). In the presently preferred process, the substrate 25 is a low conductivity substrate (50 ohm cm) and is doped with a p-type dopant. Commonly employed "front end" processing steps are used to form the field oxide regions 26 with their underlying channel stop regions 27. These field oxide regions are grown at openings in an overlying silicon nitride layer 29 as is well-known. A relatively thin silicon dioxide layer 28 is grown on the substrate prior to the formation of the silicon nitride layer 29. By way of example, the field oxide regions 26 are approximately 7000 A–8000 A thick, the oxide layer 28 is 400 A thick, and the silicon nitride layer 29 is approximately 800 A thick. This front end processing is described in U.S. Pat. No. 4,033,026.

Next, as shown in FIG. 2, section 25a of the substrate is subjected to arsenic ion implantation as illustrated by lines 30a, to form the n-type region 31 after removal of the silicon nitride layer 29. The other substrate section 25b is subjected to a boron doping step as indicated by lines 30 to form the p-type region 33. In the presently preferred process, the arsenic doped region 31 is doped to a level of $10^{12}$ to $10^{13}/cm^2$ and the boron doped region is doped to a level of approximately $10^{11}$ to $10^{12}/cm^2$. The region 31 is used for a channel in a depletion mode transistor while the region 33 is used for a channel in an enhancement mode transistor. Separate masking steps and doping steps are used to form the regions 31 and 33. If the circuit is to have transistors with threshold voltages other than the two established by regions 31 and 33 (such as zero threshold transistors), the process described in U.S. Pat. No. 4,052,229 may be employed.

Now as shown in FIG. 3, an opening is formed through the oxide layer 28 at the location of a buried contact region. An ordinary masking and etching step is used to make this opening. Then, a phosphorus doped polysilicon layer 35 is formed over the substrate. This layer is 3000 A–4000 A thick in the presently preferred process. The phosphorus dopant from the layer 35 diffuses into the substrate at the sites of the buried contacts to form, for example, the region 37 at the opening 36.

As illustrated in FIG. 4 a silicon nitride layer 38 is formed over the polysilicon layer 35; this layer may be approximately 400 A thick. In the presently preferred process, a thin oxide layer is formed on the polysilicon layer 35 prior to the formation of the silicon nitride layer.

Next ordinary masking and etching steps are used to define circuit members, such as gate members and interconnecting lines. In FIG. 5, two gate members 35a and 35b are shown. As is well-known, first a photoresist layer is used to form the masking members 38a and 38b from the silicon nitride layer 38, followed by the etching of the oxide layer separating the nitride layer from the polysilicon layer, and then the etching of the polysilicon layer 35. (Note for sake of simplicity, the buried contact region 37 and opening 36 are not shown in FIGS. 5–9). The substrate is then subjected to an arsenic implant to form source and drain regions. For example, source and drain regions 39 are formed in alignment with gate member 35a and source and drain regions 40 are formed in alignment with gate member 35b. In the presently preferred embodiment, the arsenic implant is performed through the oxide layer 28 to a concentration level of approximately $10^{15}/cm^2$.

The substrate is now subjected to a re-oxidation step and a relatively thick oxide layer 41 as shown in FIG. 6 is grown. This oxidation step is done in an ordinary well-known manner such as by placing the substrate in a wet atmosphere at 920 degrees C. The silicon nitride masking members 38a and 38b of FIG. 5 prevent the growth of oxide on the upper surfaces of the gate members 35a and 35b, respectively. After the growth of the oxide layer 41, these masking members are removed as shown in FIG. 6. In the presently preferred process, the oxide layer 41 is grown to a thickness of approximately 2000 A.

An ordinary metallization step is next used to form metal members on the polysilicon members. These metal members may be formed on all of, or selected ones of the polysilicon members. As illustrated in FIG. 7, a metal member 43 is formed over the polysilicon gate member 35a. However, no metal member is formed over the gate member 35b. A light etching step is first used to assure that the upper surfaces of the gate members 35a and 35b are free of silicon dioxide, otherwise good contact is not made with the polysilicon. The aluminum member 43 is shown not in perfect alignment with the polysilicon gate member 35a since typically some misalignment occurs in the masking step used to define the metal members. It is these metal members which substantially reduce the resistance of the underlying polysilicon members and thereby increase the speed of the circuit.

Referring now to FIG. 8, an additional metallization step may be employed to form tungsten members on the upper surfaces of the polysilicon members. In the presently preferred process, a commercially available tungsten deposition system is employed (sold by AMT Corporation) which deposits tungsten on polysilicon while not forming tungsten on silicon nitride or silicon dioxide. This process results in the self-alignment of the tungsten members directly with the polysilicon members. Thus, as illustrated in FIG. 8, the member 44 forms only on the exposed polysilicon of gate member 35a and completely covers the upper surface of the gate member 35b. The tungsten members may be formed directly on the polysilicon without aluminum members. Alternatively, the tungsten members may be formed directly on the polysilicon circuit members followed by the formation of aluminum over the tungsten members.

Following the formation of these metal members, the remaining processing steps must be selected to eliminate high temperature steps (e.g., above 600 degrees C.) to prevent silicide formation and/or oxidation of the tungsten. In the presently preferred process, a plasma nitride layer is formed over the substrate covering the circuit members (including the metal) and oxide layer 41. The plasma nitride 47 layer is shown in FIG. 9.

Now the circuit may be completed by adding an additional layer of metallization and forming contacts through the plasma nitride layer 47 to selected substrate regions and circuit members. The glass reflowing step associated with the prior art is not required. A process for fabricating sloped edges in a plasma nitride layer (for contacts) is described in copending application Ser. No. 236,833 filed Feb. 23, 1981, entitled "Process for Forming Opening Having Tapered Sides in Plasma Nitride Layer", which application is assigned to the assignee of the present invention.

ADDITIONAL PROCESSING FOR METAL COVERED SOURCE AND DRAIN REGIONS

FIGS. 10-12 show additional processing which may be employed with the above-described process in order to form metal covered source and drain regions adjacent to a metal covered gate member. In FIG. 10, the silicon nitride masking member 38a of FIG. 5 is illustrated with the underlying polysilicon gate member 35a after the growth of the relatively thick oxide layer 41. When the oxide layer 41 is grown, oxide also grows on the sides of the polysilicon member 35a. Assume, for example, that the polysilicon member 35a is etched in direct alignment with the masking member 38a, that is, without undercutting. The polysilicon member prior to the formation of the oxide layer 41 would extend to the dotted lines 48. When the oxide layer 41 is grown, a portion of the member 35a is oxidized and approximately 2000 A of oxide is formed on the sides of the gate member. (Note oxide regions will also form on the side of the gate member even if undercutting occurred during the etching of the gate member 35a.) Now the oxide layer 41 may be etched in alignment with the silicon nitride member 38a. This leaves the oxide regions 50 on the sides of the polysilicon member 35a as shown in FIG. 11; note the oxide is completely removed above the source and drain regions 39.

Next if the self-aligning tungsten deposition system above-discussed is used, the tungsten members 51 are formed above the source and drain regions while the tungsten member 52 is formed above the gate member as shown in FIG. 12.

Another method for obtaining the oxide regions 50 employing ion bombardment is described in copending application Ser. No. 231,121 filed Feb. 3, 1981 entitled "Process for Forming Metal Plated Regions and Lines in MOS Circuits", assigned to the assignee of the present invention now U.S. Pat. No. 4,330,931.

ALTERNATE BURIED CONTACT PROCESSING

Referring briefly again to FIG. 3, a prior art method for forming a buried contact region is shown in this figure. Specifically, the etching of the opening 36 and the formation of the polysilicon directly in the opening in contact with the substrate, is frequently used in the prior art. FIGS. 13-16 show an alternate method for forming a buried contact.

Referring to FIG. 13, the silicon nitride member 38a and the gate member 35a of FIG. 5 are again illustrated. In FIG. 14, the structure is again shown after the growth of the second oxide layer 41.

Figure 15:
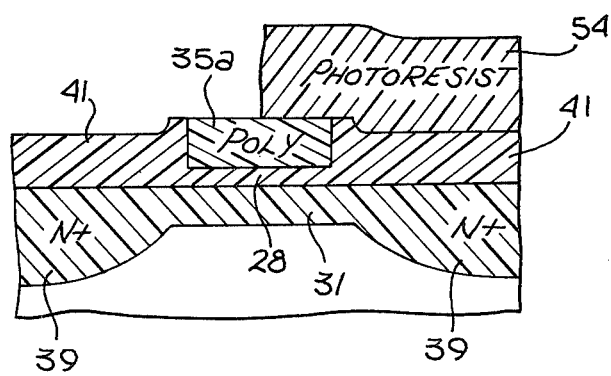
Figure 16:
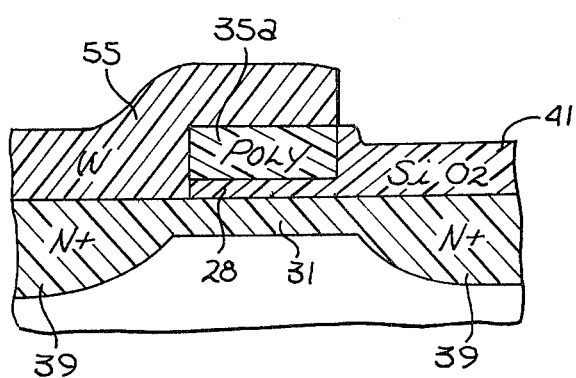

Now, the silicon nitride member is removed and a photoresist masking layer is used to expose the source and part of the drain or the buried contact region. As shown in FIG. 15, the photoresist layer 54 exposes a portion of the gate member 35a and the adjacent oxide layer 41 (to the left of the gate member). Because of typical masking misalignments part of the gate member is exposed. Now an oxide etchant is used to etch away the exposed oxide layer, that is the oxide layer to the left of the gate member 35a. This etching step exposes the underlying region 39. A metal contact is formed using the above-described self-aligning tungsten step after the photoresist layer is removed. The metal member 55 of FIG. 16 is formed in contact with the exposed substrate region and in contact with one side and the upper surface of the polysilicon gate member 35a. In this manner, the gate member 35a is electrically coupled to one of the regions 39, as is often done for depletion mode transistors used as load devices.

The key advantage to the above-described buried contact process, is that it does not require direct masking of the gate oxide layer as is necessary to form the opening 36 through layer 28 of FIG. 3. The layer 28 is typically thin and can be damaged during the masking and etching steps. Note that as best shown in FIG. 15, the masking step for forming the buried contact with the new process is applied to the relatively thick, more durable, oxide layer 41.

ALTERNATE PROCESSING USING ORIGINAL $Si_3N_4$ LAYER

In the alternate processing shown in FIGS. 17-23, more use is made of the original silicon nitride layer, that is, the layer used to form the field oxide regions (layer 29 of FIG. 1).

Figure 17:
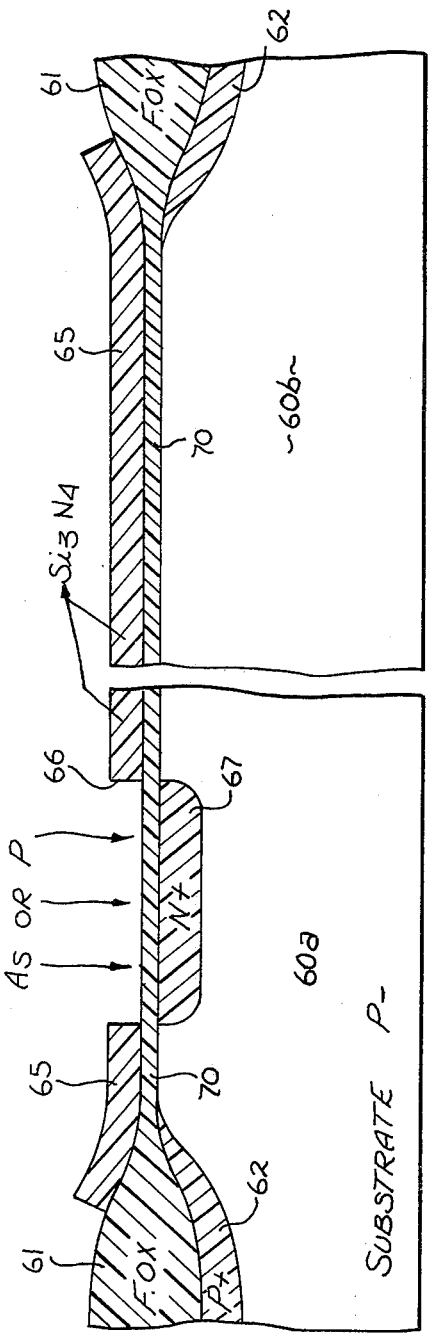

Referring now to FIG. 17, a p-type monocyrstalline silicon substrate 60 is shown, divided into sections 60a and 60b. The presently preferred substrate again is of low conductivity (50 ohm cm). A relatively thin oxide layer 70 (e.g., 400 A thick) is first grown on the substrate. Then a silicon nitride layer 65 is formed over the silicon dioxide layer 70 and a masking step is used to define openings for the field oxide regions. After a doping step, the field oxide regions 61 are grown.

Now using an ordinary masking and etching step, an opening 66 is etched through the original silicon nitride layer 65. These openings are formed at the sites of the depletion mode transistors. An arsenic or phosphorus dopant is used to form region 67. This region corresponds to region 31 of FIG. 2.

Figure 18:
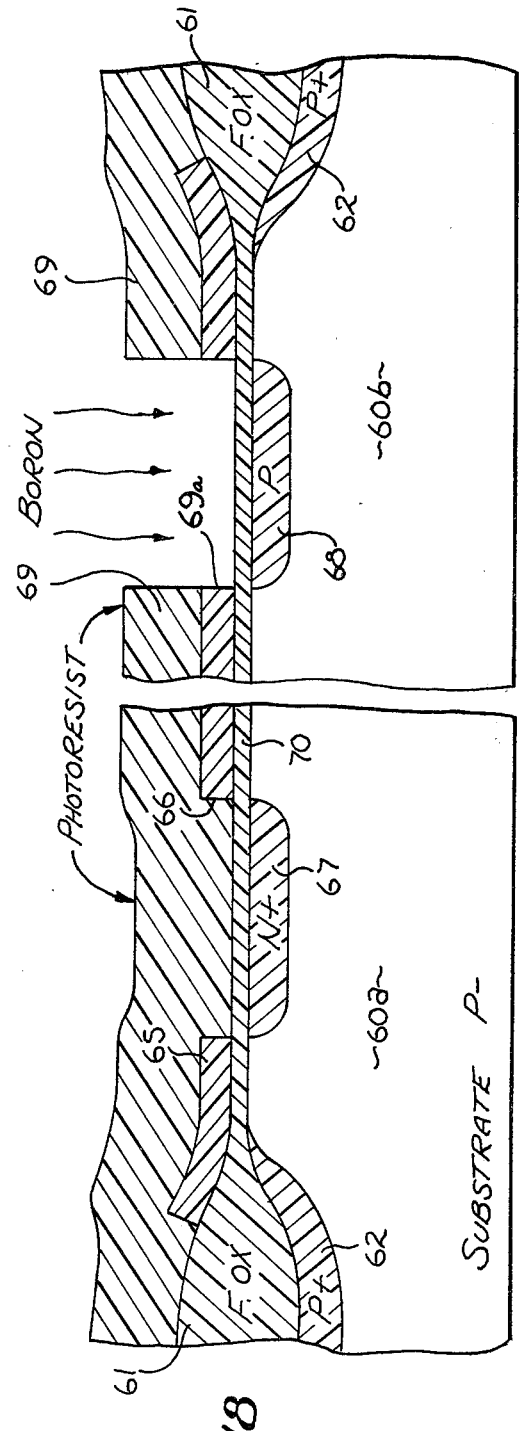

Next as shown in FIG. 18, a photoresist layer is formed over the substrate and an opening 69a is formed through the photoresist layer and underlying silicon nitride layer 65. A p-type dopant such as boron is then used to form the doped region 68. This region is used as a host region for enhancement mode transistors and corresponds to region 33 of FIG. 2. Again where transistors having threshold voltages other than those resulting from regions 67 and 68 are needed, the teachings of U.S. Pat. No. 4,052,229 may be employed.

A layer of polysilicon is now formed over the substrate, again this layer may be approximately 3000 A-4000 A thick. After the formation of a thin oxide layer on the upper surface of the polysilicon layer, a silicon nitride layer is formed over the polysilicon layer. Ordinary masking and etching steps are then used to define the silicon nitride masking members 76a and 76b of FIG. 19 and the underlying gate members 73 and 74, respectively. As indicated by lines 72, a heavy dose of arsenic is implanted into the substrate to define source and drain regions specifically regions 78 in alignment with gate member 73 and regions 79 in alignment with gate member 74.

Referring now to FIG. 20, the substrate is subjected to an oxidation step to grow a relatively thick oxide layer (e.g., 2000 A). The oxide regions 83 are formed over the source and drain regions 78 in section 60a. Note that a thick oxide is not grown on the sides of the oxide regions 83 because these regions are protected by the silicon nitride layer 65. Similarly, the oxide regions 84 are formed on the sides of the gate member 74 and again, thick oxide is not grown to the sides of the regions 84 because of the silicon nitride layer 65. After growth of the regions 83 and 84, the silicon nitride members are removed, leaving the structure shown in FIG. 20.

While not shown, buried contacts can be formed as shown in FIG. 2 or as described in conjunction with FIGS. 13-16.

As indicated in FIG. 21, by lines 85, the substrate is again subjected to an ion implantation step to extend the source and drain regions, the extended regions being shown as the regions 78a and 79a. This arsenic implantation step may be performed through the oxide layer 70 of FIG. 20, or as shown in FIG. 21, the oxide layer may be removed prior to the ion implantation. The relatively thick oxide regions 83 and 84 are not removed when the thinner oxide is etched.

Now referring to FIG. 22, the above described self-aligning tungsten deposition system may be used to form metal members above the source and drain regions and above the gate members once the thin oxide layers are removed. For example, the metal members 89 are formed above the source and drain regions 78a and the metal member 87 is formed above the gate 73. Also for the enhancement mode transistor, the metal member 88 is formed above the gate member 74 and the metal members 90 are formed above the source and drain regions 79a. The oxide regions 83 and 84 provide good separation between the metal above the source and drain regions and the metal on the upper surface of the gate members.

Figure 23:
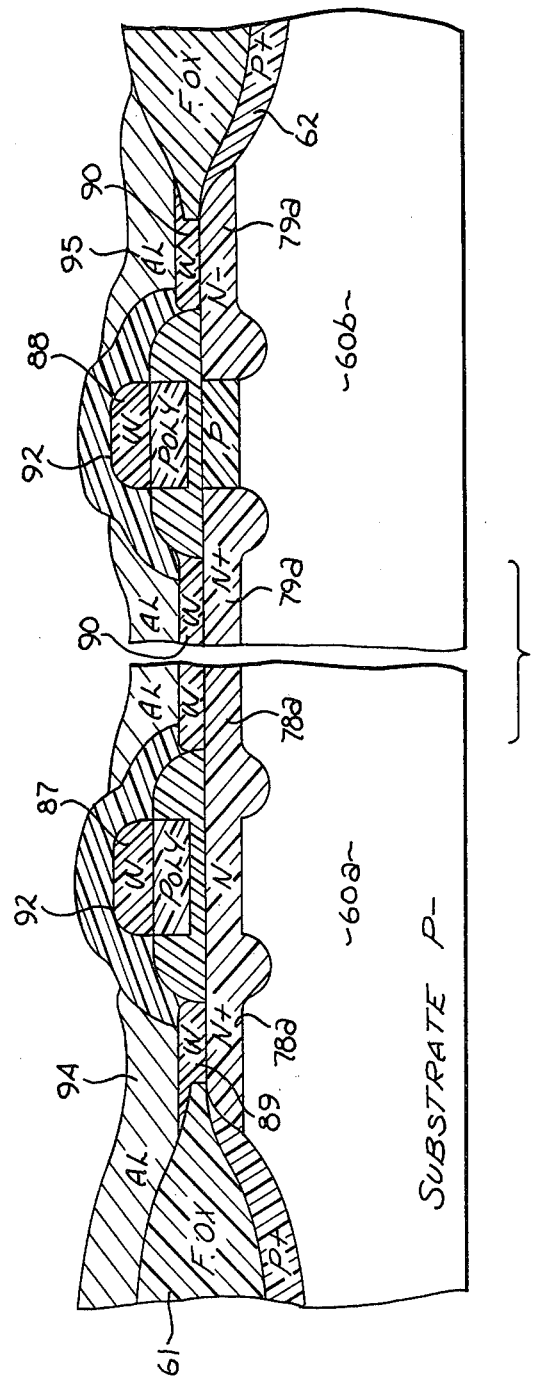

As shown in FIG. 23, a plasma nitride layer 92 is now formed over the entire substrate and openings etched through this layer as described above. After an additional metallization step, metal lines and contacts are formed in contact with the underlying tungsten metal members. For example, the aluminum contact 94 is in electrical contact with a metal member 89 and similarly the aluminum member 95 is in contact with the tungsten member 95.

An important advantage to the above described alternate process is that the original silicon nitride layer is used to define large portions of the second oxide layer. This provides substantial alignment advantages. Note that as shown in FIG. 23, and as also is true for the process described in conjunction with FIGS. 1-9, the final metal layer is in contact with underlying metal members such as the tungsten members, thereby providing low resistance connections.

In a companion application, a structure and process is described which may be used in the above described processes. See "Integrated Circuit Resistor and Method of Fabrication", Ser. No. 236,652, filed Feb. 23, 1981 and assigned to the assignee of the present invention.

Thus, a process has been desdribed for forming low resistance polysilicon/metal and silicon/metal circuit members such as gate members. Low temperature processing is used after the formation of the underlying metal members to prevent deterioration of these members.

We claim:

1. A process for fabricating a metal-oxide-semiconductor (MOS) integrated circuit on a silicon substrate including the steps of:
    growing a first oxide on said substrate;
    forming a polysilicon layer over said first oxide layer;
    forming a silicon nitride layer over said polysilicon layer;
    defining a plurality of circuit members from said polysilicon layer employing masking members formed from said silicon nitride layer;
    forming a plurality of source and drain regions in said substrate in alignment with at least some of said circuit members;
    growing a second oxide layer on said substrate, said silicon nitride members preventing growth of oxide on said circuit members;
    removing said silicon nitride members;
    forming metal members on said polysilicon circuit members, said metal members for increasing the conductivity of said circuit members;
    covering said substrate with a protective layer, said layer being processed at a sufficiently low temperature to prevent deterioration of said metal members; and,
    forming metal interconnections and contacts over said protective layer, to interconnect at least some of said circuit
    whereby low resistance polysilicon/metal buried contact members are formed in an MOS circuit.

2. The process defined by claim 1 wherein said protective layer comprises plasma nitride.

3. The process defined by claim 2 wherein said metal members comprise aluminum members.

4. The process defined by claim 2 wherein said metal members comprise tungsten members.

5. The process defined by claim 1 wherein prior to the formation of said polysilicon layer, field oxide regions are formed on said substrate employing a silicon nitride layer.

6. The process defined by claim 5 including the step of forming buried contact regions which permit said polysilicon layer to contact predetermined substrate regions.

7. The process defined by claim 6 wherein said second oxide layer is relatively thick when compared to said first oxide layer.

8. The process defined by claim 7 wherein said protective layer comprises plasma nitride.

9. The process defined by claim 8 wherein said source and drain regions are formed by implanting arsenic into said substrate.

10. The process defined by claim 9 wherein the formation of said metal members comprises the formation of tungsten members.

11. A process for fabricating a metal-oxide-semiconductor (MOS) integrated circuit on a silicon substrate including the steps of:
    growing a first oxide layer on said substrate;
    forming a polysilicon layer over said first oxide layer;
    forming a silicon nitride layer over said polysilicon layer;
    defining gate members from said polysilicon layer employing members formed from said silicon nitride layer as masking members;
    forming source and drain regions in said substrate in alignment with said gate members;

growing a second oxide layer on said substrate, said silicon nitride layer preventing growth of said second oxide layer on said gate members, said second oxide layer grown such that oxide regions are formed on the sides of said polysilicon gate members;

etching said second oxide layer at least over said source and drain regions employing said silicon nitride members as a masking member such that said oxide regions remain on the sides of said gate members;

removing said silicon nitride members; and, forming metal members on the exposed source and drain regions and on said gate members;

whereby metal covered source and drain regions and metal covered polysilicon gate members are formed.

12. The process defined by claim 11 wherein said formation of said metal members comprise the formation of tungstein in a self-aligning step such that tungsten is not formed on said oxide regions.

13. The process defined by claim 12 wherein said first oxide layer is substantially thinner than said second oxide layer.

14. The process defined by claim 13 including the formation of a plasma nitride layer over said substrate following the formation of said metal members.

15. In a process for fabricating a metal-oxide-semiconductor (MOS) integrated circuit on a silicon substrate, an improvement for forming a buried contact region comprising the steps of:

growing a first oxide layer on said substrate;

forming a polysilicon layer over said oxide layer;

forming a silicon nitride layer over said polysilicon layer;

defining a gate member from said polysilicon layer employing a member etched from said silicon nitride layer as masking member;

forming source and drain regions in alignment with said gate member;

growing a second oxide layer on said substrate, said silicon nitride member preventing the growth of said oxide on the upper surface of said gate member;

forming a masking member which covers one of said source and drain regions;

etching said oxide layer so as to expose the other of said source and drain regions; and, forming a metal member which contacts said upper surface of said gate member and contacts said exposed region;

whereby a buried contact region is formed.

16. The process defined by claim 15 wherein said step of forming said metal member comprises the step of forming a tungsten member.

17. The process defined by claim 16 wherein said first oxide layer is relatively thin when compared to said second oxide layer.

18. A process for fabricating a metal-oxide-semiconductor (MOS) integrated circuit on a silicon substrate including the steps of:

growing a first oxide layer on said substrate;

forming a silicon nitride layer above said first oxide layer;

forming openings in said silicon nitride layer at predetermined sites;

forming gate members of polysilicon in said openings said gate members insulated from said substrate;

forming source and drain regions in said openings in alignment with said gate members;

growing a second oxide layer on said substrate, said silicon nitride layer preventing the growth of said second oxide layer in regions spaced-apart from said openings;

removing at least portions of said silicon nitride layer adjacent to said source and drain regions;

extending said source and drain regions beyond said regions encompassed by said openings; and, forming metal members on said substrate, in contact with at least a portion of said source and drain regions and forming metal members on the upper surface of said gate members;

whereby a single nitride layer is used to control the growth of oxide in two separate oxide growing steps.

19. The process defined by claim 18 wherein said metal members comprise tungsten.

20. The process defined by claim 19 wherein said first oxide layers is relatively thin when compared to said second oxide layer.

21. The process defined by claim 20 including the step of forming a plasma nitride layer over said substrate covering said metal members.

* * * * *

UNITED STATES PATENT AND TRADEMARK OFFICE
CERTIFICATE OF CORRECTION

PATENT NO. : 4,441,247

DATED : Apr. 10, 1984

INVENTOR(S) : Gargini et al.

It is certified that error appears in the above-identified patent and that said Letters Patent is hereby corrected as shown below:

| COLUMN | LINE | DESCRIPTION |
|---|---|---|
| | | In the title between the words "Composite" and "Gate" please insert --Metal--. |
| 8 | 28 | After the word "circuit" please insert --members--. |
| 9 | 21 | Please delete "tungstein" and insert --tungsten--. |

Signed and Sealed this

Twenty-seventh Day of January, 1987

Attest:

DONALD J. QUIGG

Attesting Officer     Commissioner of Patents and Trademarks